United States Patent [19]

Harnden

[11] Patent Number: 5,711,806
[45] Date of Patent: Jan. 27, 1998

[54] PRINTED CIRCUIT BOARD PROCESSING APPARATUS

[76] Inventor: Eric F. Harnden, 1030 Berne Dr., Crestline, Calif. 92325

[21] Appl. No.: 615,723

[22] Filed: Mar. 13, 1996

[51] Int. Cl.$^6$ .................. B05C 3/02; B05C 3/00; B05C 19/02
[52] U.S. Cl. .................. 118/407; 118/423; 118/424; 118/425; 427/96
[58] Field of Search .................. 118/423, 407, 118/424, 425; 427/428, 96

[56] References Cited

U.S. PATENT DOCUMENTS

| 657,323 | 9/1900 | Thickins . | |
|---|---|---|---|
| 1,876,050 | 9/1932 | Fox . | |
| 2,130,545 | 9/1938 | Heath | 91/12.2 |
| 2,750,923 | 6/1956 | Daniel . | |
| 2,820,754 | 1/1958 | Brower . | |
| 2,884,893 | 5/1959 | Kabelitz | 118/424 |
| 3,236,680 | 2/1966 | Hnot . | |
| 3,241,521 | 3/1966 | Labombarde | 118/424 |
| 3,601,090 | 8/1971 | Vallon | 118/423 |
| 3,699,919 | 10/1972 | Coffman | 118/56 |
| 3,768,493 | 10/1973 | Kraeft | 134/46 |
| 3,815,617 | 6/1974 | Faust | 134/133 |
| 3,868,272 | 2/1975 | Tardoskegyi | 134/26 |
| 4,196,023 | 4/1980 | Rowe | 148/6.15 |
| 4,233,084 | 11/1980 | Bergsand | 134/67 |
| 4,263,122 | 4/1981 | Urquhart | 294/300 |
| 4,268,206 | 5/1981 | Johnson | 414/222 |
| 4,282,825 | 8/1981 | Nagatomo et al. | 118/58 |
| 4,408,560 | 10/1983 | Caratsch | 118/69 |
| 4,608,941 | 9/1986 | Morris | 118/63 |
| 4,745,004 | 5/1988 | Schwerin | 427/96 |
| 4,828,878 | 5/1989 | Mankut et al. | 427/98 |
| 4,966,672 | 10/1990 | Levit et al. | 204/198 |
| 5,007,369 | 4/1991 | Morris | 118/56 |
| 5,186,600 | 2/1993 | Wokeck et al. | 414/793.4 |
| 5,201,974 | 4/1993 | West | 156/47 |
| 5,248,340 | 9/1993 | Nakagawa et al. | 118/422 |
| 5,297,568 | 3/1994 | Schmid | 134/62 |
| 5,374,331 | 12/1994 | Costello | 156/640 |
| 5,417,829 | 5/1995 | Zecher | 204/214 |

FOREIGN PATENT DOCUMENTS 096506  3/1980  Japan .

Primary Examiner—Donald E. Czaja
Assistant Examiner—Jacqueline A. Ruller
Attorney, Agent, or Firm—Oppenheimer Poms Smith

[57] ABSTRACT

A machine for use in chemically processing printed circuit board work pieces includes an inner basin within an outer basin. The inner basin holds a chemical liquid bath through which the printed circuit board work pieces are passed by a conveyor in a horizontal orientation along an action line parallel to their own plane. The conveyor includes facilities to oscillate the work pieces perpendicularly to their plane in the chemical liquid bath to effect flow of the chemical liquid through holes and apertures of the work pieces. Part of the chemical liquid bath continuously drains from the inner basin to the outer basin as the chemical treatment process is in operation. An eductor draws liquid from the outer basin and effects a low-pressure, high-volume up-welling of liquid into the inner basin. In this way, stirring of the chemical liquid bath is effected, and both temperature and concentration stratification of the chemical liquid bath is avoided. A chemical processing line may include several layers of the machines ranked one above the other to increase output with no increase in required floor space.

16 Claims, 5 Drawing Sheets

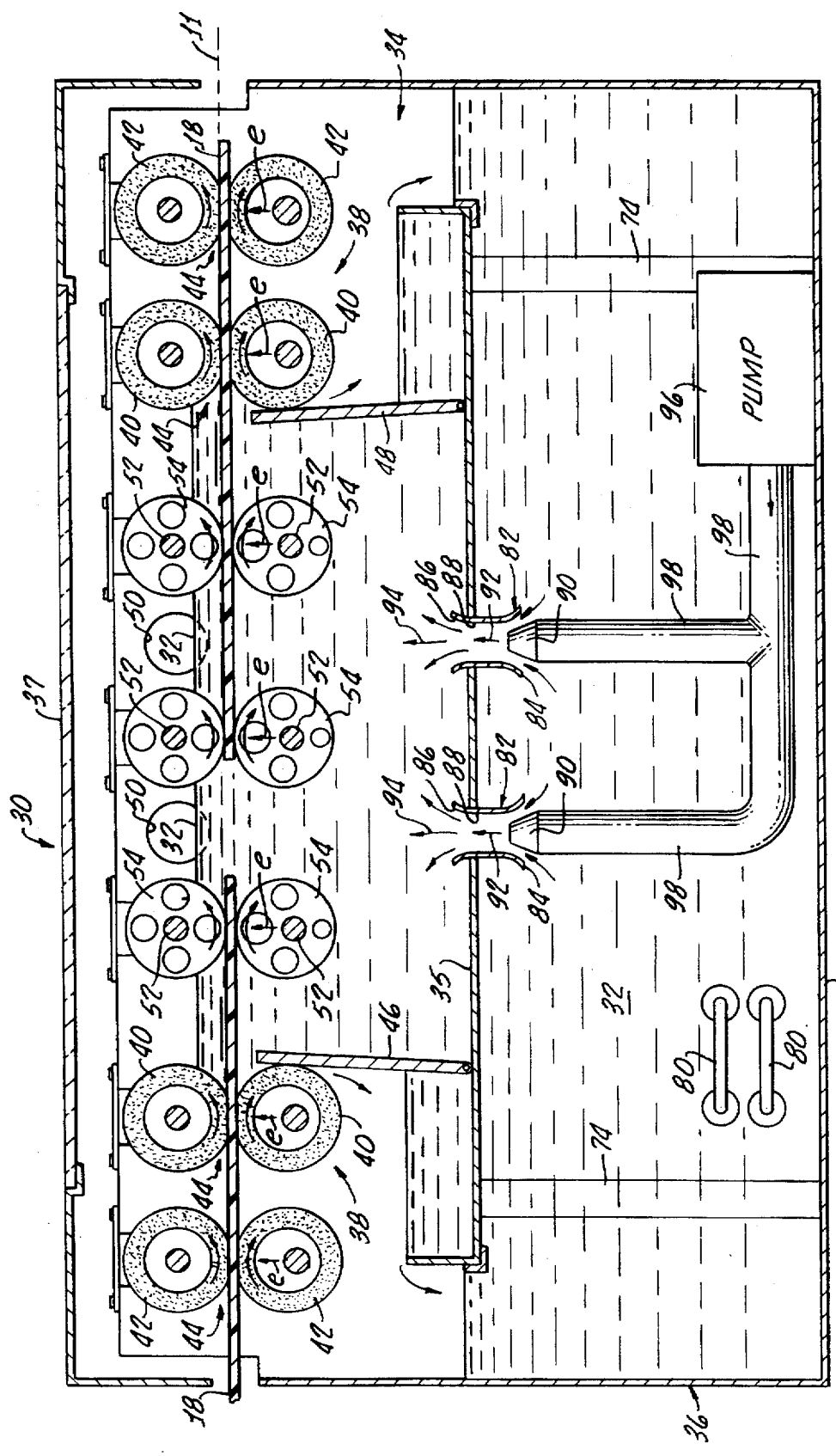

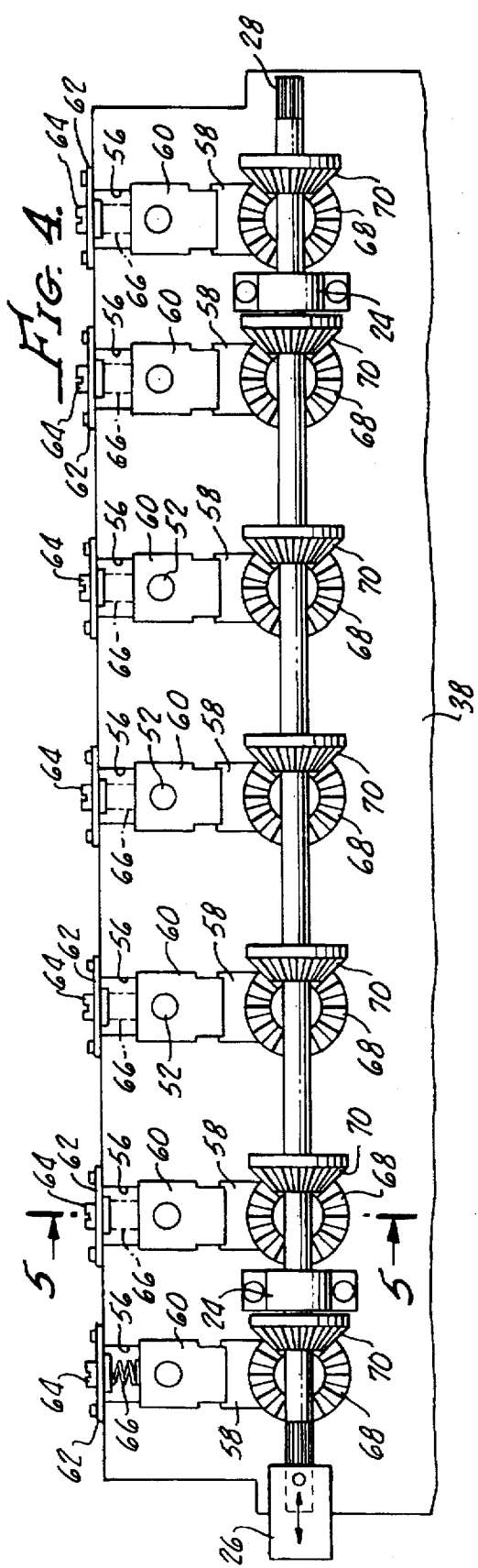
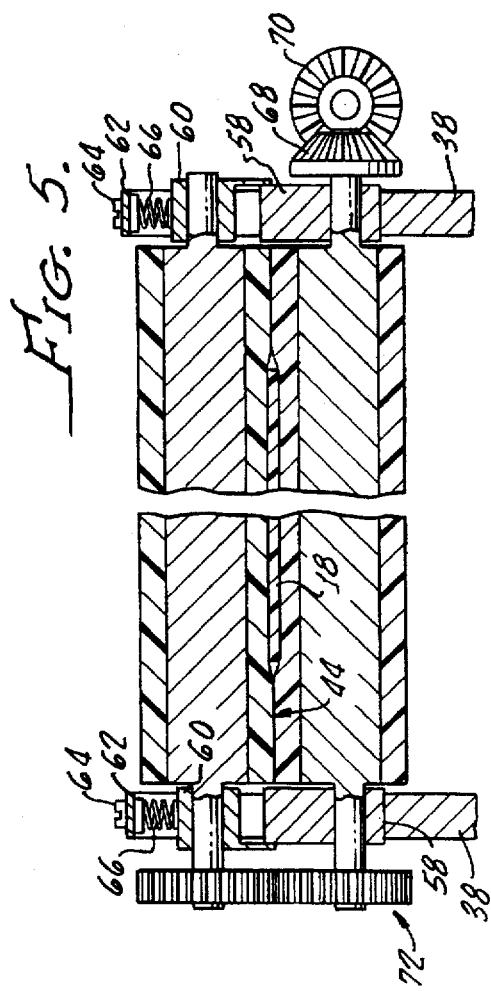
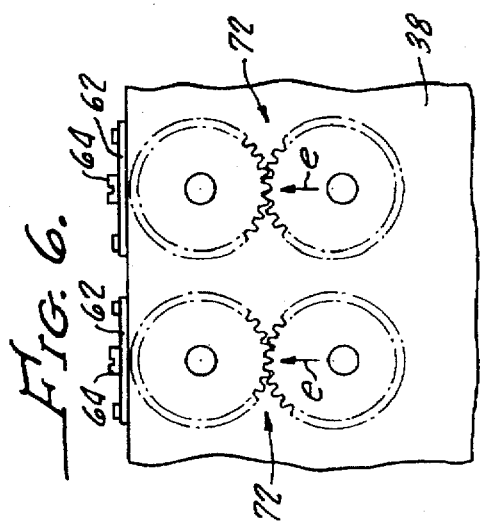

PRINTED CIRCUIT BOARD PROCESSING APPARATUS

BACKGROUND OF THE INVENTION

FIELD OF THE INVENTION

The present apparatus and method is in the field of chemically processing printed circuit boards. One objective of such processing of printed circuit board work pieces is to provide electrically conducive through holes in the finished printed circuit boards. Another objective may be to provide a surface conductive to the formation on the work pieces of traces in a pattern in which electrically conductive metal is to be laid down, or in which metal is to remain after an over-all application of conductive metal followed by photo-resistive exposure and etching. More particularly, printed circuit boards are generally thin, planar, possibly multi-layer constructions of alternating conductive and insulative layers laminated together. The conductive layers may be formed of copper or other metallic material, in the form of foil, electro-deposited metal, or electroless metal, while the insulative layers may be formed of phenolic, fiberglass, nylon, teflon, or other materials. In order to provide either for electrical interconnection of the various conductive layers of such a printed circuit board at a particular location, or to provide for soldered connection of an electrical lead to a discreet component on the printed circuit board, for example, a through hole is provided in the printed circuit board. These through holes are provided with a metallic conductive coating along the sides of the hole and interconnecting the various conductive layers of the printed circuit board. The metallic coating also provides for solder connection of an electrical lead which is first inserted through the hole.

RELATED TECHNOLOGY

In order to provide low-cost, high-volume processing of printed circuit boards a considerable array of devices and methods have been developed. For example, after the laminated circuit board work pieces are completed, the through holes must be formed in these work pieces. The work pieces for the printed circuit boards are generally about 0.060 inch, or greater, in thickness. In order to form the though holes in the laminated circuit board work pieces, high speed precision drilling machines have been developed. These drilling machines can drill holes as small as about 0.004 inch diameter, and having a length-to-diameter ratio of at least 10:1, through the material of the laminated work pieces for the printed circuit boards. Because of the small diameter and relatively great depth of these through holes, the drilling operation is carried out by "pecking" the drill. That is, the spinning drill is first advanced into and part way through the work piece, and then is at least partially withdrawn in order to allow the flutes of the spinning drill to clear themselves of chips. By successive pecking operations carried out at high speed, very small and comparatively deep through holes are formed in the laminated material of the printed circuit board work pieces.

After such through holes are formed, the conductive metallic layer along the walls of such small and relatively deep through holes must be formed. Conventional technology teaches to pass the printed circuit board into a liquid bath containing a colloidal suspension of conductive material. A powerful jet of liquid is used to force out air from the through holes and to force a through flow of liquid carrying a conductive colloidal material. Some of this conductive material lodges or is deposited along the walls of the through holes. Later, the printed circuit board work piece is immersed into a electroless plating bath. The electroless solution forms a thin metallic layer along the walls where the conductive material has provided an electrochemical nucleation site for the electroless process. This thin layer of metallic material provides an electrically conductive path between the conductive layers of the work piece. Still later, the printed circuit board is placed in an electrolytic plating bath, and the plating solution plates additional metallic material along the walls of the through holes. Because the prior conductive material along these hole walls is electrically continuous with the penetrated metallic layers of the printed circuit board work piece, these metallic layers can be contacted to complete the electroplating circuit.

A persistent problem with the conventional technology is that the electroless plating operation is difficult and unwieldy to control and maintain in correct operation. A common problem for these electroless plating operations is for the metallic material in the solution to plate out on the walls of the tank, for example. Additionally, the thickness of material deposition within the through holes of printed circuit board work pieces is difficult to control. Some work pieces may have an inadequate or incomplete metallic coating applied by this electroless process along the walls of the through holes, while other work pieces have a coating which is much too heavy.

Conventional technology which may be considered relevant to the present invention is found in one or more of the following United States patents:

U.S. Pat. No. 657,323, issued 4 Sep. 1900 to J. C. Thickens is believed to disclose an apparatus for dyeing fabric and yarn. This apparatus includes a conveyor chain immersed in a bath of dye. The conveyor chain carries receptacle for the fabric or yarn, and includes controlled slack sections between adjacent support and drive sprockets so that the receptacles rock froward and back in the dye as the conveyor chain is advanced.

U.S. Pat. No. 2,750,923, issued 19 Jun. 1956 to M. P. Daniel is believed to present a hot-dip galvanizing apparatus, which could also be applied to electroplating facilities. This device apparently includes a rail and trolley conveyor system, in which the trolleys carry a depending yoke from which is supported a work piece dipping into a vat of molten zinc for galvanizing the work pieces. The support rail includes a lifter section, which is essentially a ramp with a shear drop off, in order to first slightly lift and then drop the work pieces with a controlled vertical jarring motion. The shear drop off of the lifting section may include interrupters so that the drop is a series of smaller drops of steps back to the level of the conveyor rail. In the galvanizing use of this device, the jarring of the work pieces within the zinc bath is asserted to be effective to clean the work pieces. In the electroplating use of the device, the device is asserted to remove bubbles clinging to the outside of the work pieces.

U.S. Pat. No. 3,815,617, issued 11 Jun. 1974 to Elbert R. Faust is believed to disclose a continuous plating system in which a trough is suspended movably in a fluid electroplating bath. The trough is cyclically moved both forwardly and upwardly, and is then allowed to rapidly return to an initial position. The work pieces on this trough subsequently advance along the trough and rearrange themselves relative to the trough and to each other with each cycle of the motion applied to this trough. In order to provide the desired motion to the trough, one embodiment uses a plurality of pivotal support arms depending from a support structure into the bath and to the trough. These arms are moved by an eccentric cam drive in the forward and upward direction, and are returned to their initial position by springs. Double-acting piston-in-cylinder actuators may be used to move the trough of an alternative embodiment of the device.

U.S. Pat. No. 4,196,023, issued 1 Apr. 1980 to Arthur J. Rowe is believed to show a device for treating automobile bodies with a phosphate solution. In this device, the automobile body is suspended from a conveyor system on depending supports extending into a tank having the liquid phosphate solution therein. An opposite flow of the solution is maintained in the tank as the automobile body moves from one end of the tank to the other. The body is partially lifted out of the solution and reinserted intermediate of the ends of the tank somewhat in a dipping motion. Other provisions are also made to maintain a flow of the solution from within the automobile body outwardly thereof, and for replenishing the solution as phosphates therefrom are consumed in the treatment process.

U.S. Pat. No. 4,268,206, issued 19 May 1981 is believed to show a treating machine for articles held in perforate barrels. The perforate barrels are supported from cantilevered arms of a conveyor device, and are movable both laterally and vertically to be immersed in a series of baths or tanks along the length of an electroplating line. In their lowered positions, the barrels may be oscillated about a horizontal axis in the solutions of particular tanks.

U.S. Pat. No. 4,745,004, issued 17 May 1988 is believed to disclose a method and apparatus for use in processing printed circuit boards, and for through-plating the holes in such printed circuit boards. The apparatus is believed to include a housing with a plurality of processing tanks containing liquid baths. Above these liquid baths a conveyor device moves along the housing and includes provisions for lowering and elevating rack-like work holders into and from the baths. The printed circuit boards are carried in these rack-like work holders, and are moved from bath to bath by the conveyor device.

Another conventional device for chemical treatment of electronic components is disclosed by U.S. Pat. No. 4,966,672, issued 30 Oct. 1990 to Boris Levit, et al. The '672 patent is believed to disclose a conveyor apparatus in which two drive chains are oriented at differing elevations adjacent opposite sides of a row of processing chemical tanks. Depending from the drive chains are plural unequal length pairs of arms, with each pair of arms supporting a respective product carrier basket. As the drive chains move parallel to the length of the row of processing tanks, the baskets are lowered into the tanks, moved along the length of the tanks, and raised out of these tanks successively by respective declining, horizontal and elevating sections of the drive chains. Appropriately positioned sprockets for the drive chains establish the declining, horizontal and elevating sections of the drive chains. In this way, the product baskets move upwardly over the tank end walls and dip downwardly into successive tanks along the row of tanks.

Still another way of moving parts to be treated between a succession of chemical treatment tanks is believed to be disclosed in U.S. Pat. No. 5,417,829, issued 23 May 1995 to Robert F. Zecher. According to the '829 patent, a row of tanks for containing chemical treatment solutions receive parts to be treated in respective baskets which can be immersed into the tanks. The baskets are movable both in elevation and in tip angle between respective receiving, treatment, draining, and discharge positions. In the discharge position of a basket, the parts therein are discharged either to another conveyor or to the next successive basket of the next successive processing tank in its respective receiving position.

Another conventional chemical treatment apparatus using a flexible wire net belt to move parts along the apparatus is disclosed in Japanese publication NO. 55-12199 of 7 Aug. 1975. As best understood, this device uses a conveyor belt of wire net played over a series of rollers within a processing tank to define a series of declining steps along the length of the tank. As parts fall from level to level along this wire net belt, they are tumbled to differing positions. At the end of the wire net belt, the parts fall to a circular elevator which raises them out of the liquid of the processing tank.

Still another conventional chemical treatment device for printed circuit board work pieces is known. This conventional device includes a conveyor mechanism moving printed circuit board work pieces in a horizontal orientation along a horizontal processing line including several processing tanks containing various processing liquids. The levels of the processing liquids in the various tanks are maintained about equal to one another. The printed circuit board work pieces on the conveyor mechanism are maintained at a level below the liquid level in the various processing tanks, and are moved from tank to tank at this same level. In order to substantially contain the processing liquids in the tanks, and also to allow the printed circuit board work pieces to move between tanks at their conveying level below the liquid level of these tanks, the conveyor mechanism includes pairs of powered pinch rollers spanning the ends of the tanks and engaging one another and the side walls of the tanks to prevent gross loss of liquid. The pinch rollers are resilient enough to distort elastically and allow the printed circuit board work pieces to pass between these paired rollers into and out of the various tanks of the device. In some cases, the pinch rollers are both elastic and are spring loaded toward one another so that they can also move slightly apart to allow the printed circuit board work pieces to pass therebetween. An end partition of each tank cooperates with the lower one of the respective pair of these pinch rollers inwardly of the processing tank to limit loss of liquid from the tank.

A conventional expedient which is used to limit gross loss of liquid between this partition and the lower pinch roller is a free-running rod about equal in length to the width of the processing tank. This rod lays in the gap between the pinch roller and the partition to act as a rotating seal member. The lower pinch roller and partition are so disposed relative to one another that the rod lays in the gap at about the lateral median level of the roller. Thus, as the roller rotates, the rod is driven in rotation with the roller, and slides in its contact with the partition. A persistent problem with this expedient it that the quality of liquid seal provided is very much dependent on the diameter of the rod and the relationship of this diameter to the dimension of the gap between the lower pinch roller and the partition. Of course, as the pinch roller wears, this dimension changes. If the rod is too small, it can be drawn through the gap between the roller and partition so that once the rod is gone from its desired location in the gap, gross loss of liquid from the tank occurs. On the other hand, if a rod of too large a diameter is used, the quality of seal provided is not very good, and again, an excessive loss of liquid from the tank results.

Liquid which is lost from a processing tank past the leakage control features described above is caught in respective basins or gutters and is drained to a separate respective reservoir below the processing tank. From the respective reservoir, high-pressure and high-volume pumps are used to move the liquid back up to the respective processing tank. Within the processing tanks of this conventional processing device, high-pressure jets of the processing liquids provided by the high-pressure pumps are directed onto the surfaces of the printed circuit board work pieces in order to effect treatment of the surfaces and through holes of these work pieces. In order to control movements of the printed circuit board work pieces which would result from these jets of high-pressure liquid impinging on the work pieces, an array of opposed guide wheels is provided on opposite sides of the work pieces. At least the lower ones of these guide wheels are also powered in order to synchronize movements of the work pieces horizontally along the processing line below the surface of the liquids in the various processing tanks.

Additionally, the solutions, mixtures, and suspensions used in this conventional processing equipment tends to both temperature-stratify and to concentration-stratify. That is, heavy concentrated solution, mixture, or suspension will accumulate at the bottom of the reservoir. Also, higher temperature liquid which is lower in density will stratify at the top of the reservoir, with cooler liquid below. As a result, the reservoir can stratify into dense concentrated and cool liquid at the bottom with higher temperature but less concentrated liquid at the top. Understandably, this stratification tendency is contrary to the desire to maintain tight process control and uniform chemistry in the chemical processing tank. Also, the conventional high-pressure pump conventionally used to supply the high-pressure jets of liquid in the processing tank does not ordinarily supply enough liquid to the processing tank to maintain its desired level, nor enough agitation to the reservoir to prevent this stratification. Consequently, additional high-volume pumps are used to provide agitation for the reservoir, and to return liquid from the reservoir to the processing tank at a rate sufficient to maintain the desired liquid level.

A significant disadvantage of this conventional technology outlined immediately above is the fact that a conventional printed circuit board processing facility may require both excessive square footage of floor space and excessive energy consumption on a per-board basis. That is, on the basis of square footage of floor space required for a facility of a particular capacity, the conventional processing lines for printed circuit board work pieces have an exceptionally large foot print. In addition to the foot print of the equipment itself on the facility floor, additional floor space is required for access to the machines for maintenance and repair, as well as for operation and monitoring of this operation during processing of the printed circuit board work pieces in the equipment. In order to increase the capacity of a facility using the conventional machines, the square footage must be increased proportionately.

In terms of energy consumption, the conventional equipment for chemically treating printed circuit board work pieces are high consumers of electrical energy. A major contributor to this energy consumption are the pumps and motors used for high-pressure and high-volume circulation of the processing liquids within the reservoirs and from the reservoirs to the processing tanks.

SUMMARY OF THE INVENTION

In view of the deficiencies of conventional technology, including those examples of this conventional technology summarized above, a primary object for this invention is to avoid one or more of these deficiencies.

An additional object for this invention is to provide an apparatus and method for chemically processing printed circuit board work pieces which allows a considerably reduced foot print for the equipment on a factory floor.

Further to the above, an object for this invention is to provide an apparatus and method for chemically processing printed circuit board work pieces which allows plural processing lines to occupy the same foot print for the equipment on a factory floor.

Still another object for this invention is to provide an apparatus and method for chemically processing printed circuit board work pieces which reduces the utilization of electrical energy for pumping of processing liquids in comparison to the conventional technology.

Accordingly, the present invention provides a machine for chemically treating the surfaces of a panel-like printed circuit board work piece by immersion in a liquid chemical bath, the work piece having one or more through holes or apertures therein, the machine comprising: a basin for containing a bath of chemical liquid for treating the surfaces of the work piece, a conveyor for moving the work piece in a horizontal orientation horizontally along an action line parallel to its own plane through the bath of chemical liquid, the conveyor including means for oscillating the work piece perpendicularly to its own plane simultaneously with motion along the action line, whereby the oscillation causes surging of the chemical liquid through the apertures or through holes of the work piece.

An advantage of the present invention results from the reduction in energy consumption per printed circuit board work piece processed of the inventive machine compared to machines of the conventional technology.

According to another aspect, the present invention provides a machine for chemically treating the surfaces of a panel-like printed circuit board work piece by immersion in a liquid chemical bath, the machine comprising: an inner basin for containing a bath of chemical liquid for treating the surfaces of the work piece, a conveyor for moving the work piece in a horizontal orientation horizontally along an action line parallel to its own plane through the bath of chemical liquid, an outer basin below and around the inner basin also for containing the chemical liquid, the inner basin having a floor defining a hole providing for gravitational draining of the chemical liquid bath downwardly into the outer basin, and means for effecting a high-volume low-pressure up-welling of liquid from the outer basin upwardly through the hole into the inner basin to maintain a liquid level therein above the liquid level in the outer basin during operation of the machine.

Another advantage of the present invention is that a processing machine according to the invention may be made vertically smaller and more compact than conventional machine, thus allowing processing lines for printed circuit board work pieces to be stacked one atop another in the same foot print as a conventional processing line, while having an increased production capacity.

Additional objects and advantages of the present invention, as well as a better understanding of the invention, will be obtained from reading the following description of a single preferred exemplary embodiment of the present invention when taken in conjunction with the appended drawing Figures, in which the same feature (or features analogous in structure or function) are indicated with the same reference numeral throughout the several views. It will be understood that the appended drawing Figures and description here following relate only to one or more exemplary preferred embodiments of the invention, and as such, are not to be taken as implying a limitation on the invention. No such limitation on the invention is implied, and none is to be inferred.

BRIEF DESCRIPTION OF THE DRAWING FIGURES

FIG. 1 provides a perspective elevation view of a processing line including plural sequentially-arranged chemical processing machines for chemically processing printed circuit board work pieces, and having part of the structure broken away to better illustrate internal features of the structure;

FIG. 2 provides a diagrammatic plan view of a chemical processing machine of the processing line seen in FIG. 1;

FIG. 3 is a diagrammatic elevation view of a representative chemical processing machine seen in FIG. 2;

FIG. 4 provides a fragmentary side elevation view of a machine seen in FIGS. 1–3;

FIG. 5 is an end elevation view, partially in cross section, of a machine seen in FIGS. 1–4;

FIG. 6 provides a fragmentary side elevation view of a part of a machine seen in FIGS. 1–5;

FIG. 7 is an enlarged fragmentary elevation view, partly in cross section, of a machine seen in FIGS. 1–6; and FIG. 8 is a greatly enlarged fragmentary cross sectional view of a printed circuit board work piece under chemical processing in one of the machines seen in FIGS. 1–7.

DETAILED DESCRIPTION OF AN EXEMPLARY PREFERRED EMBODIMENT OF THE INVENTION

Figure 1:
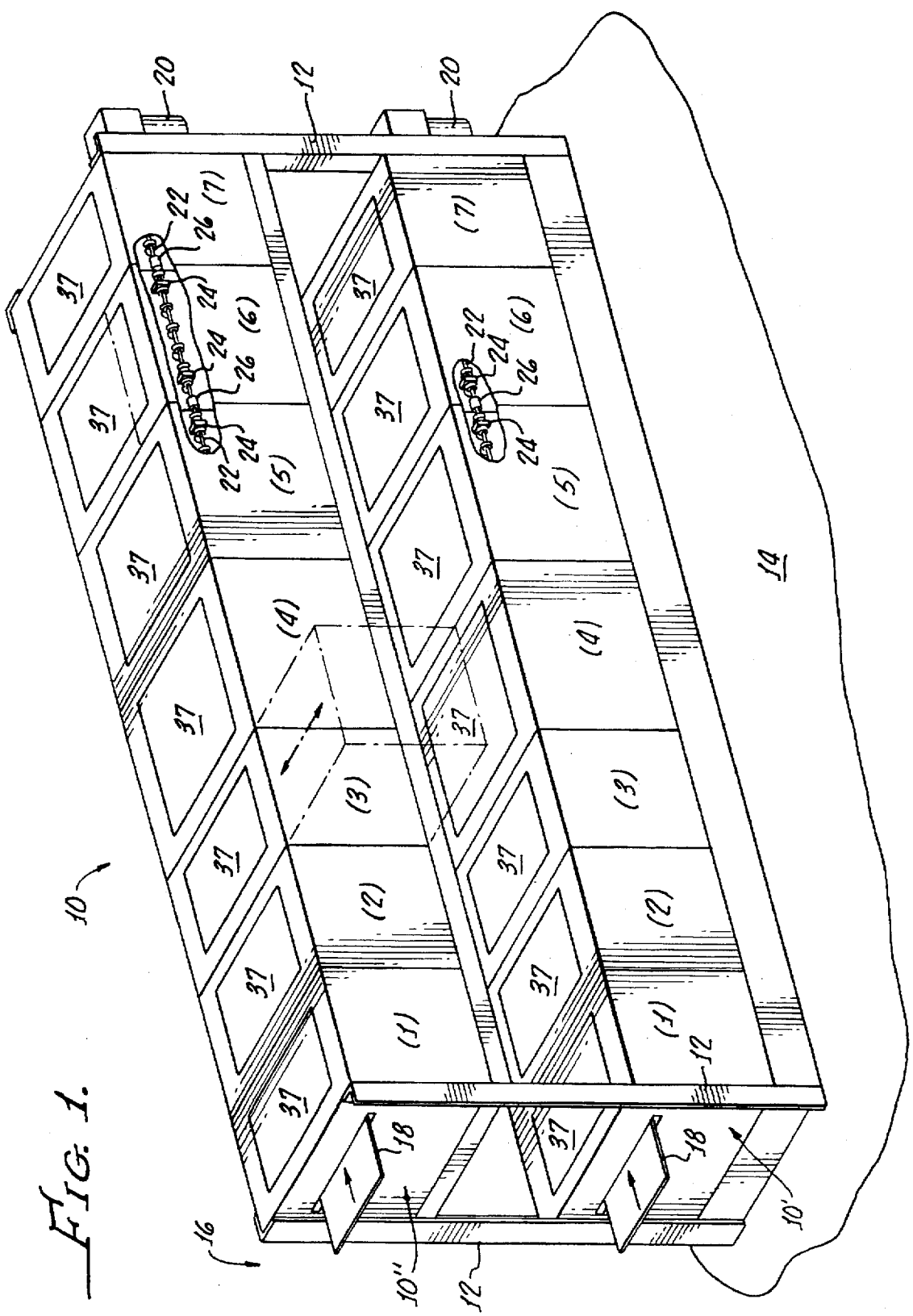

FIG. 1 depicts a perspective elevation view of a processing line 10 of plural processing machines in sequence for chemically treating printed circuit board work pieces. These printed circuit board work pieces are hereinafter referred to as "PCBWP's". The processing line 10 includes an elongate rack 12. In the present embodiment the rack 12 has two vertically spaced apart processing levels. The lower one of these processing levels in indicated in FIG. 1 with the numeral 10', while the upper level is indicated with the numeral 10". Preferably, the upper and lower processing levels of the line 10 will have duplicate processing machines, although this in not necessarily the case. That is, the upper and lower levels of the processing line can be configured to carry out the same or differing processes. In the illustrated embodiment, the line 10 includes seven duplicate processing machines in sequence in each of the levels 10'and 10". Preferably, each of these seven machines performs a respective one of the following seven processes on PCBWP's traveling therethrough: (1) cleaning, (2) microetching, (3) conditioning, (4) pre-dipping, (5) activation (i.e., application of tin/palladium), (6) acceleration (i.e., application of copper metal from a solution having copper ions therein), and (7) acid rinse. Accordingly, each of the machines in line 10 bears a parenthetical number indicating the process carried out therein according to the preceding list. The machines 1 through 7 of the above list in sequence are not duplicates of one another, and may differ from one another as is further described below. Further, machines 3, 5, and 6 of the line 10 may include provisions for oscillating printed circuit board work pieces as they pass though these machines. The remaining four machines of the line 10 may also include this feature, although they need not include the oscillation feature in order for the processing line to operate satisfactorily.

The machines of the processing line are modular and are removably secured to the rack 12 so that any machine can be removed laterally out of the processing line for maintenance or repair, for example, and can be replaced by a substitute machine allowing continued operation of the processing line 10. Accordingly, FIG. 1 shows by dashed lines the lateral removal (and replacement) of machine No. 6 from the processing level 10". Because the desired residence time of PCBWP's in the various processes differs while the transport speed through the machines is all the same, the machines differ in length along the length of processing line 10. It can be seen that because the processing line 10 includes two levels of machines, the processing capability of the line is twice what it would be with a single level of machines, and in the same floor space required for only one level of processing. It will be further understood that dependent upon the physical constraints of the building structure in which the line 10 is installed, the processing line 10 may have more than two processing levels. Consequently, by use of the present invention, a printed circuit board processing facility may produce two, three, four, or more times its present capacity of printed circuit boards with no increase in required floor space.

Along side of the processing line 10 is defined an elongate walkway 14 from which access to the various processing machines of the line can be made, as will be further explained. A similar walkway (which is not visible in the drawing Figures) may extend along the opposite side of the processing line 10. At the near end of the processing line 10, as viewed in FIG. 1, provision is made at 16 for introducing the panel-like PCBWP's 18 edge-first into the first processing machines of the line 10 at the levels 10'and 10", as is indicated by the arrows. As is well understood, the PCBWP's are panel-like objects which are planar, comparatively thin articles. In general, the PCBWP's may range from 18 inches by 24 inches to 24 inches by 36 inches in size. In thickness, these panels range from about 0.004 inch to 0.250 inch. As will be seen, the PCBWP's will have through holes formed therein, which may range from 0.004 inch to 0.500 inch in diameter. Generally, these through holes which are intended to become conductive vias in the printed circuit board, or to accommodate the soldered securing of a wire lead from an electronic component, will range from 0.008 inch to 0.020 inch in diameter.

The PCBWP's 18 are generally fabricated of phenolic or fiberglass, for example, and each may become a single printed circuit board, or may include several printed circuit boards in a single panel. In the latter case, after processing of the printed circuit boards is completed, they are separated out of the panel from one another. These PCBWP's are introduced into the machines of the line 10 edgewise in a horizontal orientation for linear movement in the direction of their own plane, and will be moved along the processing line 10 in this orientation. In the generally preferred sizes of PCBWP's, these panels have their 24 inch dimension oriented across the width of the processing machines. Consequently, the machines of the processing line 10 are preferably sized to accept a PCBWP of at least 24 inches in width, although the machines may be constructed to process panels of lesser or greater width.

The provision 16 for introducing these PCBWP's into the line 10 may simply be a person manually feeding the PCBWP's into the first processing machines of the line 10, but more preferably a conveyor and feeding device (which are known to those ordinarily skilled in the pertinent art) will be used to automatically feed in the PCBWP's at a timed rate into the first machines of the line 10 from a magazine supply (not shown) of these work pieces 18. At the opposite end of the line 10 (not visible in the drawing Figures) the processed PCBWP's are discharged in condition for further processing into finished printed circuit boards. These processed PCB- WP's are placed in racks or magazines, for example, either manually or by use of an automated handling machine, for further processing. It will be understood that the line 10 is a continuous-flow processing line, so that once a PCBWP is introduced into the first machine of the line, it continues its progress along the line and through all seven processing machines in synchronized movement with the PCBWP's previously introduced therein.

To this end, the processing line 10 at one end includes a respective power drive head 20 for the machines in each of the processing levels 10'and 10". By way of example only, the power drive heads 20 may include a variable-speed gear-head electric motor having an output shaft drive feature (not seen in the drawing Figures) which is compatible with the machines of the processing line, as is explained below. Each of the process machines of the line 10 includes an elongate internal drive shaft 22, which is seen in the broken away section of two adjacent machines in FIG. 1. This elongate drive shaft 22 is journaled in bearing blocks 24 of the respective machine, and has a universal joint drive coupling 26 at one end and a drive feature 28 at the other end. The universal joint drive coupling 26 is comparable with the output shaft drive feature of the power drive head 20, and with each drive feature 28 of the other machines. Similarly, the drive feature 28 of each machine is comparable with the universal joint drive couplings 26 of the other machines. Thus, as is seen in FIG. 1, the machines are coupled together to be driven in synchronization by the power drive heads 20. The rack 12 provides for mutual alignment of the machines to one another so that the shafts 22 are generally parallel and aligned with one another, and so that any misalignment of the shafts 22 is within the capability of the universal joint drive couplings 26.

Figure 2:
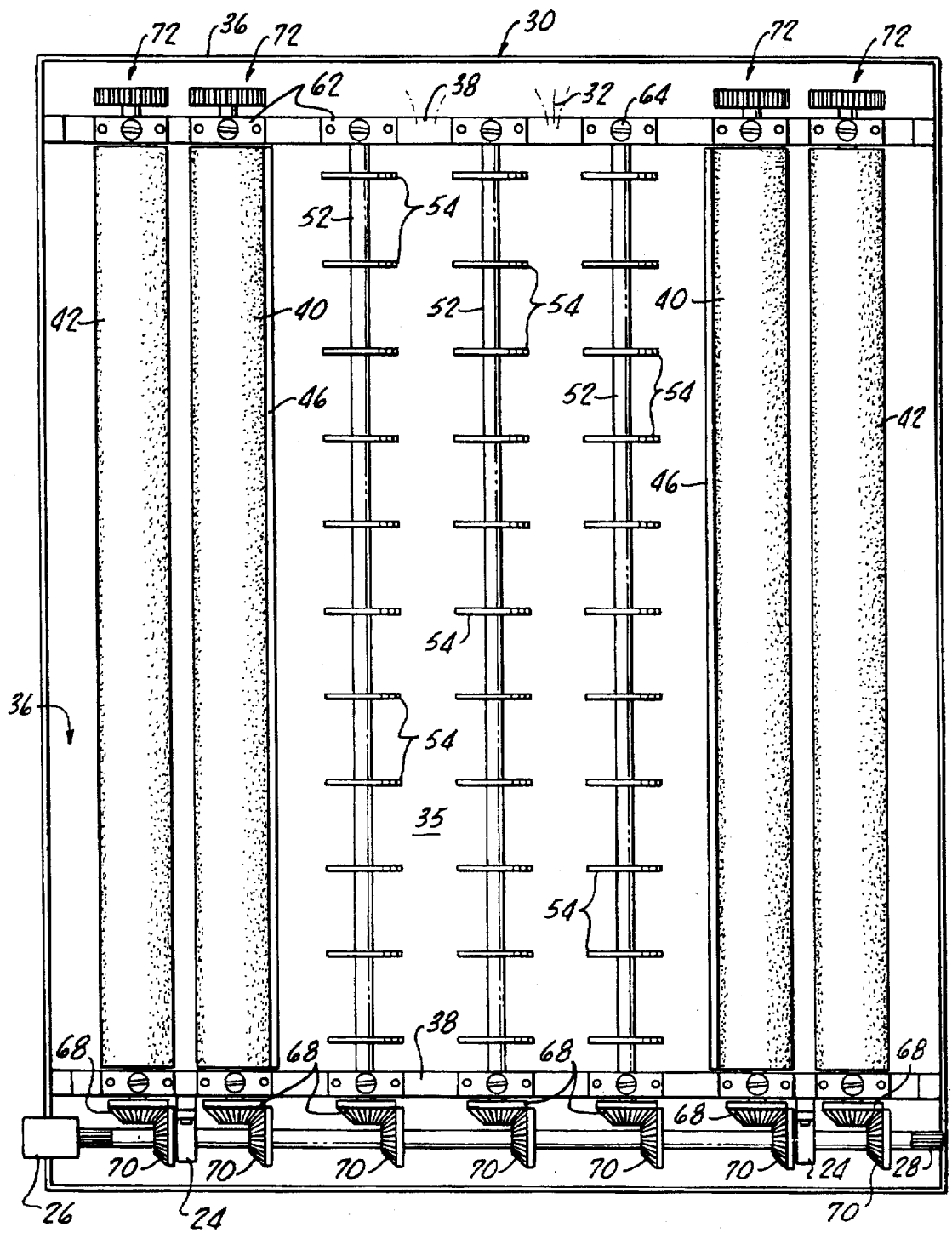

Turning now to FIGS. 2–6 in conjunction, with attention first to FIGS. 2 and 3, an exemplary processing machine 30 of the line 10 is depicted in plan view and in side elevation view. The chemical processing of the PCBWP's 18 is illustrated in these views particularly. This processing occurs by passing the PCBWP's 18 in succession edgewise and in a horizontal orientation through a bath of liquid chemical 32. That is, the PCBWP's are passed along an action line 11 (which is part of the processing line 10) parallel to their own plane. The length of a particular machine 30 along the processing line 10 may vary dependent upon the residence time desired for PCBWP's 18 in the particular chemical bath of the machine, as was explained above. In general, the machine 30 is configured as a shallow rectangular basin (or pan) 34 within and elevated a few inches with respect to an outer rectangular basin (or pan) 36 (in both plan and elevation view). The outer basin 36 is provided with an apertured cover 37 seen in FIGS. 1 and 3. The inner basin 34 has a floor 35 and opposed upstanding side walls 38 which constrain the bath of liquid chemical 32.

In order to constrain the liquid 32 at the ends of the inner basin 34, while still allowing the panel-like PCBWP's to pass into and out of the liquid 32, the machine 30 includes two pairs of vertically disposed resilient rollers 40 and 42 extending between the side walls 38. The rollers 40 and 42 extend from one side wall 38 to the other (as is best seen in FIG. 2) and closely approach these side walls so that only a controlled leakage of liquid chemical 32 occurs from the inner basin 34 to the outer basin 36 at the ends of these rollers. The rollers 40 and 42 of each pair engage one another along a pinch line 44 (best seen in FIG. 5) so that liquid leaks only at a minor rate between these rollers. The rollers 40 and 42 are also resilient enough to allow a PCBWP 18 to pass between these paired rollers. Preferably, the resilient portion of these rollers if fabricated from a material known as "Hydrolon". This material is hydrophilic, but not porous on a macro scale. Accordingly, it does not introduce air bubbles into the chemical processing liquid, and avoids oxidation of this liquid which could result because of such air bubbles. In addition, as will be seen, the upper one of the paired rollers may be spring loaded to allow it a slight upward movement, thereby additionally accommodating the PCBWP's 18 as they pass between the rollers.

The lower one of each of these vertically paired rollers 40 is slidably engaged along its length between the side walls 38 by an upper portion of a generally vertically extending and slightly outwardly spring-loaded respective inlet movable wall member 46 and outlet movable wall member 48, respectively. The wall members 46 and 48 are each hingably attached at their lower ends to the floor 35 of the inner basin 34. In view of the above, it will be appreciated that the inner set of rollers 40 and walls 46, 48 are the primary barrier to liquid loss from basin 34, with the outer set of rollers 42 and wall serving as a secondary fluid-squeegee type of fluid barrier structure. The liquid level in basin 34 is lower than the top of the upper roller in each pair 40 and 42, so that there is little or no liquid loss from the basin 34 over the top of the roller pairs 40. In addition to the leakage of liquid from the basin 34 along the paths already referred to, the liquid level for this basin 34 is set by one or more V-shaped weirs 50 formed in the side walls 38. These weirs 50 allow drainage of liquid from inner basin 34 to outer basin 36. As a result, the liquid level in inner basin 34 is determined by the overall rate of liquid leakage from this inner basin, and by the rate of pumped liquid delivery into this basin, as will be seen.

Also received in the basin 34 are vertically disposed pairs of horizontally extending generally parallel shafts 52. Each of these shafts 52 drivingly carries a spaced apart plurality of mutually engageable guide and propulsion wheels 54. That is, the guide wheels of these pairs of shafts may engage one another when a circuit board work piece 18 in not between the shafts. When a circuit board work piece 18 is between the shafts 52 of a pair, then the guide wheels 54 engage the PCBWP 18, and the lower powered guide wheels 54 assist in moving this work piece 18 through the respective machine. As is seen viewing FIG. 4, the side walls 38 of the inner basin 34 define respective vertically extending notches 56 for receiving the shafts 52. The lower ones of the shafts 52 are carried at their opposite end portions in bearing blocks 58 seated in the lower part of each notch 56. The upper shaft 52 of each pair of shafts is carried at its opposite end portions in respective bearing blocks 60 which are slidably received for vertical motion in the upper extent of the respective notches 56. Spanning each respective notch 56 is a cap member 62 which not only provides for capture of the shafts 52 and bearing blocks 58 and 60 in the notch 56, but also provides threaded mounting for a spring pre-load adjustment screw 64. Extending between the pre-load adjustment screw and the upper bearing blocks 60 is a respective pre-load spring 66 (best seen in FIG. 7).

The mounting and bearing hardware for the shafts of the resilient rollers 40 and 42 is the same as that for the 52, so it is seen that the upper members of the paired rollers 40 and 42 and the upper ones of the paired guide wheel Shafts 52 with upper guide wheels 54 are all spring loaded downwardly toward an underlying one of these paired guide wheels and rollers. However, these spring-loaded rollers, guide wheel shafts and guide wheels can also yieldably move upward slightly in order to accommodate movement of a PCBWP 18 through the machine 30, as well as to accommodate a vertical oscillation of these work pieces, as will be seen.

Viewing FIGS. 4 and 5, it is seen that each of the lower shafts for the pairs of rollers 40 and 42, and for the pairs of guide wheels 54, each carries a respective one of plural bevel gears 68 disposed toward the drive shaft 22 of the particular machine 30. These bevel gears 68 are drivingly engaged by respective ones of plural bevel gears 70 carried drivingly on the shaft 22. The side wall 38 of the inner basin 34 carries the bearing blocks 24 for the shaft 22, as is best seen in FIG. 4. Thus, it is seen that the lower ones of the guide wheels 54 are driven from the power drive head 20 via the drive shafts 22. Similarly, the lower ones of the rollers 40 and 42 are also driven from the shaft 22.

FIG. 6 shows that the pairs of rollers 40 and 42 are also geared together at their ends opposite to the bevel gears 68 by a pair of spur gears 72. These spur gears 72 have a coarse pitch and deep gear teeth to accommodate the slight disengaging and re-engaging radial relative movements of these gears which may occur as the shafts 52 move apart and back toward one another, for example, when a PCBWP 18 passes between the rollers 40 or 42. Also, the one of this pair of spur gears which is mounted to the lower one of the rollers 40 and 42 may be mounted eccentrically relative to their respective shafts, or may be other than round, as will be explained) to match the shape of the lower roller. This eccentric or non-round aspect of the spur gear on the lower one of the shafts for the rollers 40 and 42 matches surface velocities between the contacting surfaces of the rollers and the PCBWP's 18. The upper rollers of each pair 40 and 42 may use round concentric spur gears.

Considering now FIGS. 3, 5, and 6, it is seen that each of the lower ones of the roller pairs 40 and 42, as well as each of the lower ones of the guide wheels 54, is slightly eccentric. That is, these rollers and guide wheels have an eccentricity of about one-half millimeter (indicated with the arrowed character "e" on FIGS. 3 and 6), so that a PCBWP 18 passing over these rollers and guide wheels oscillates through a distance of about 1 millimeter each time the rollers or guide wheels make one complete rotation. The rollers 40, 42, and guide wheels 54 are synchronized in their eccentricity and are all substantially the same effective diameter at any particular point in their rotation with respect to their driving engagement with the PCBWP's 18. That is, the lower rollers 40, 42, and guide wheels 54 are aligned in eccentricity and synchronized in their rotation so that the PCBWP's 18 oscillate up and down perpendicularly to their plane as they pass along the processing line 10 parallel to their own plane. Stated still another way, because of the synchronization of the rollers 40, 42, and guide wheels 54, the PCBWP's 18 are not bent or made serpentine between various rollers or guide wheels as they pass therebetween along action line 11; nor do these work pieces 18 tilt substantially or waggle as they make their way along the processing line 10. Instead, the PCBWP's oscillate in a direction perpendicular to their plane, as is indicated by the arrowed character "o" on FIGS. 3 and 7.

Figure 7:
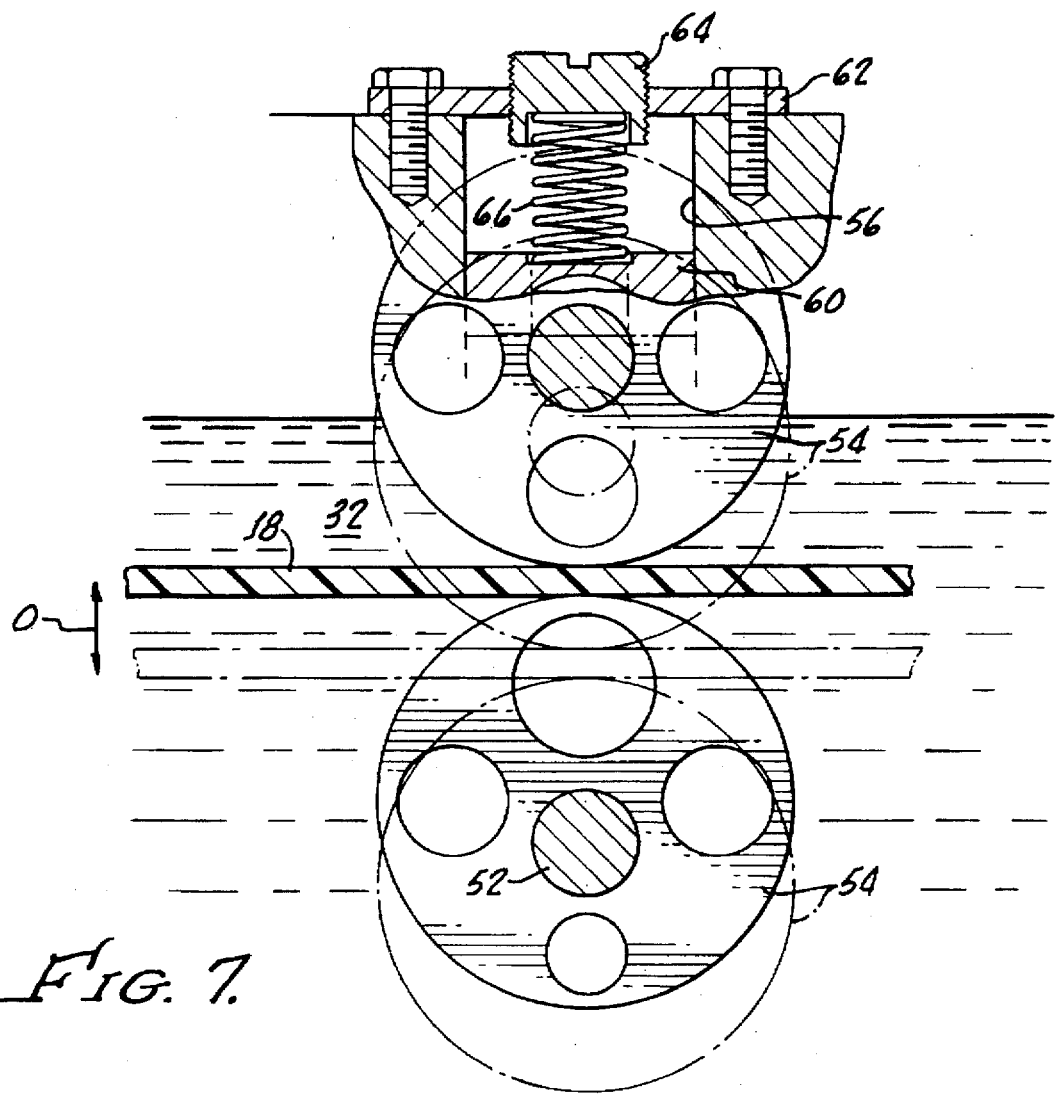
Figure 8:
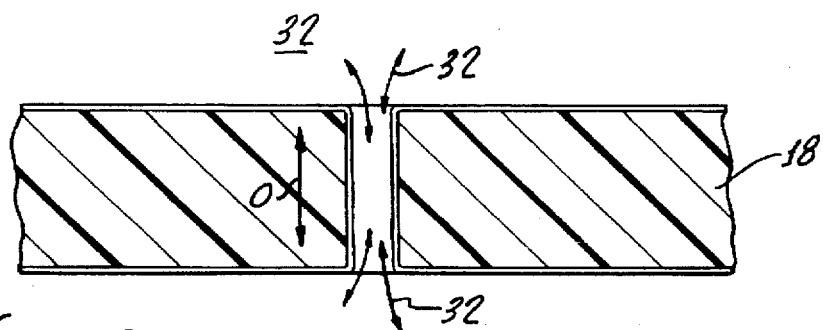

Viewing FIGS. 7 and 8, it is seen that as a result of the oscillation of the PCBWP's 18 relative to the liquid 32, this liquid surges up and down through the apertures and through holes in the PCBWP's. This liquid surging through the apertures and through holes of the PCBWP's is sufficient to insure that the desired chemical processing takes place on the surfaces defining these apertures and through holes.

In the depicted and described preferred embodiment of the present invention, the PCBWP's oscillate vertically in their own plane once each time the rollers 40, 42, or guide wheels 54 make one complete rotation. It will be understood that the rollers and guide wheels of the machine 30 may be made of a shape other than eccentric in order to effect a more frequent vertical oscillation of the PCBWP's. In other words, an oval, triangular, four-lobed, pentagonal, hexagonal, octagonal, or other cam-like shape may be used for the lower ones of the paired rollers 40, 42, and for the lower ones of the guide wheels 54 to effect a vertical oscillation of the PCBWP's 18 more frequently than once per rotation of the rollers and guide wheels. Because the spur gear pairs 72 may be made of engineering plastic, the lower ones of these pairs of spur gears may be molded in configurations necessary to match the eccentricity or cam-like shape of the rollers 40, 42 in order to match contacting surface velocities on opposite sides of the PCBWP's.

Returning now to a consideration of FIGS. 2 and 3, it is seen that the outer basin 36 is larger in plan view and deeper in elevation view than the inner basin 34. The inner basin 34 is mounted within the outer basin so that the liquid level therein during operation of the machine 30 is slightly higher than that in the outer basin 36. Outer basin 36 has a sufficient volume that it can contain all of the liquid 32, if this liquid is allowed to drain from the upper basin 34 into the outer basin. FIG. 3 shows that the inner basin 34 is supported within the outer basin 36 by plural support columns 74, which at their upper ends engage the floor 35 of the basin 34, and at their lower ends resting on the floor 76 of the lower basin. Between the floors 35 and 76, the basins cooperatively define a space or gap 78 in which is received both electric heating elements 80 and liquid eductors 82 submerged in the liquid 32. The heating elements 80 are employed under control of temperature sensors and controllers (not shown) to maintain the temperature of the liquid 32 at a desired level for effecting the desired chemical processing.

Liquid eductors 82 each have a duct defining an inlet opening 84 communicating with the liquid in the outer basin 36, and an outlet opening 86 opening to the inner basin 34 via a corresponding hole 88 in the floor 35. Each liquid eductor 82 includes a nozzle 90 issuing a high-velocity jet 92 of liquid along the eductor toward the inner basin 34. This high-velocity jet of liquid by momentum exchange inducts from about three times to as much as five times its own volume in liquid from the outer basin 36 and delivers this liquid along with the slowed jet of liquid 92 upwardly into the inner basin 34. Consequently, as is illustrated by the arrows on FIG. 3, a high-volume, low-pressure up-welling 94 of liquid from the outer basin 36 into the inner basin 34 occurs. This up-welling 94 of liquid 32 is of low pressure, but is of sufficient pressure to maintain the desired higher level of liquid in the inner basin 34, as is illustrated particularly in FIG. 3. In this respect, it will be understood that there is only a few inches of pressure head difference between the liquid levels in the inner and outer basins 34 and 36 during operation of the machine 30. This up-welling 94 of liquid is also of sufficient volume that no other stirring or agitation of the basins 34 and 36 is necessary to prevent temperature or concentration stratification of the liquid 32.

The high-velocity jet 92 of liquid originates with a high-pressure, comparatively low-volume pump 96 drawing liquid from the outer basin 36 and delivering this high-pressure liquid to the nozzle 90 via a conduit 98 within the lower basin 36. As was mentioned above, the volume of outer basin 36 is sufficient to receive all of the liquid 32 should it be desired to allow this liquid to drain from the inner basin 34. Consequently, when it is desired to shut down the machine 30, the pump 96 is shut off and the liquid 32 simply drains from the upper basin 34 through the eductors 82 and holes 88 into the lower basin 36. After the inner basin 34 is drained, it may be removed upwardly from the lower basin 36 after first disconnecting the shaft 22 from the next-adjacent machines or drive head 20 in the processing line 10. That is, the inner basin 34 along with the respective shaft 22 and associated gearing and drive parts, may be lifted out of the outer basin 36 by lifting it off the support columns 74. Alternatively, the entire machine 30 may be drained of liquid to be removed laterally from the processing line 10, recalling FIG. 1. In either case, the mechanical parts associated with the inner basin 34 are easily accessed for service and repair. After draining of the liquid 32 from the outer basin 36, the entire inner surface of this outer basin is exposed for cleaning or maintenance.

An advantage of the present arrangement of the inner basin within and closely associated with the outer basin 36 (with a comparatively vigorous stirring of the liquid 32 being effected by the eductors 82) is that no separate heater with its own circulating pump is believed to be required. It is believed that the stirring of the liquid 32 in outer basin 36 will be sufficient to circulate adequate quantities of the liquid past the heating elements 80 to maintain both adequate cooling of these elements by the liquid so as to avoid boiling adjacent to these elements 80, and good uniformity of temperature for the liquid 32. It is believed that no temperature or concentration stratifications of the liquid 32 will occur during operations of the machine 30. Further, the close heat transfer relationship of the liquid in the inner and outer basins with one another both economizes on required heating for this liquid, and reduces liberation of heat from the liquid into the ambient.

While the present invention has been depicted, described, and is defined by reference to a single particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

I claim:

1. A machine for chemically treating the surfaces of a planar printed circuit board work piece by immersion in a liquid chemical bath, the work piece having one or more through holes or apertures therein, said machine comprising: a basin for containing a bath of chemical liquid for treating the surfaces of the work piece, a conveyor for moving the work piece in a horizontal orientation horizontally along an action line parallel to its own plane through said bath of chemical liquid, said conveyor including means for oscillating the work piece perpendicularly to its own plane simultaneously with motion along said action line, whereby said oscillating of said work piece causes surging of said chemical liquid through the apertures or through holes of the work piece.

2. The machine of claim 1 wherein said conveyor includes plural vertically spaced apart parallel pairs of horizontal shafts spaced horizontally along and defining said action line therebetween, each shaft of said plural pairs of shafts carrying a cylindrical drive element engageable with a work piece passing between the pair of shafts, and said means for oscillating including one of said cylindrical drive elements of a pair of shafts having a drive surface portion which is non-concentric.

3. The machine of claim 2 wherein said one cylindrical drive element is eccentric to define a radially outer non-concentric cylindrical drive surface engageable with a work piece passing between said pair of shafts.

4. The machine of claim 3 wherein said one cylindrical drive element is configured as a linearly continuous eccentric roller extending from one side to another side of said action line.

5. A machine for chemically treating the surfaces of a planar printed circuit board work piece by immersion in a liquid chemical bath, the work piece having one or more through holes or apertures therein, said machine comprising: a basin for containing a bath of chemical liquid for treating the surfaces of the work piece, a conveyor for moving the work piece in a horizontal orientation horizontally along an action line parallel to its own plane through said bath of chemical liquid, said conveyor including means for oscillating the work piece perpendicularly to its own plane simultaneously with motion along said action line, whereby said oscillating of said work piece causes surging of said chemical liquid through the apertures or through holes of the work piece;

wherein said conveyor includes plural vertically spaced apart parallel pairs of horizontal shafts spaced horizontally along and defining said action line therebetween, each shaft of said plural pairs of shafts carrying a cylindrical drive element engageable with a work piece passing between the pair of shafts, and said means for oscillating including one of said cylindrical drive elements of a pair of shafts having a drive surface portion which is non-concentric;

wherein said one cylindrical drive element is eccentric to define a radially outer non-concentric cylindrical drive surface engageable with a work piece passing between said pair of shafts;

wherein said one cylindrical drive element is configured as a linearly continuous eccentric roller extending from one side to another side of said action line; and wherein said one cylindrical drive element also includes a spur gear eccentric to said shaft and matching the eccentricity of said linearly continuous eccentric roller.

6. The machine of claim 5 wherein the other of said cylindrical drive elements of a pair of shafts has a drive surface portion which is concentric.

7. The machine of claim 6 wherein said other cylindrical drive element is configured as a linearly continuous concentric roller extending from one side to another side of said action line.

8. The machine of claim 7 wherein said other cylindrical drive element includes a concentric spur gear.

9. A machine for chemically treating the surfaces of a planar printed circuit board work piece by immersion in a liquid chemical bath, the work piece having one or more through holes or apertures therein, said machine comprising: a basin for containing a bath of chemical liquid for treating the surfaces of the work piece, a conveyor for moving the work piece in a horizontal orientation horizontally along an action line parallel to its own plane through said bath of chemical liquid, said conveyor including means for oscillating the work piece perpendicularly to its own plane simultaneously with motion along said action line, whereby said oscillating of said work piece causes surging of said chemical liquid through the apertures or through holes of the work piece;

wherein said conveyor includes plural vertically spaced apart parallel pairs of horizontal shafts spaced horizontally along and defining said action line therebetween, each shaft of said plural pairs of shafts carrying a cylindrical drive element engageable with a work piece passing between the pair of shafts, and said means for oscillating including one of said cylindrical drive elements of a pair of shafts having a drive surface portion which is non-concentric;

wherein said one cylindrical drive element is eccentric to define a radially outer non-concentric cylindrical drive surface engageable with a work piece passing between said pair of shafts;

wherein said one cylindrical drive element includes a plurality of eccentric guide and traction wheels spaced apart along the respective shaft, each of said guide and traction wheels of said plurality having substantially the same eccentricity with respect to said shaft and being aligned with one another along said shaft from side to side of said action line.

10. A machine for chemically treating the surfaces of a planar printed circuit board work piece by immersion in a liquid chemical bath, said machine comprising: an inner basin for containing a bath of chemical liquid for treating the surfaces of the work piece, a conveyor for moving the work piece in a horizontal orientation horizontally along an action line parallel to its own plane through said bath of chemical liquid, an outer basin below and around said inner basin also for containing said chemical liquid, said inner basin having a floor defining a hole providing for gravitational draining of said chemical liquid bath downwardly into said outer basin, and means for effecting a high-volume low-pressure up-welling of liquid from said outer basin upwardly through said hole into said inner basin to maintain a liquid level therein above the liquid level in said outer basin during operation of said machine.

11. The machine of claim 10 wherein said means for effecting said up-welling of liquid from said outer basin to said inner basin includes a liquid eductor.

12. The machine of claim 11 wherein said machine includes a high-pressure low-volume pump drawing liquid from said outer basin and providing this liquid pressurized to a nozzle, said nozzle providing a jet of high-velocity fluid directed along a duct communicating at an inlet end with said lower basin and communicating at an outlet end with said upper basin via said hole.

13. The machine of claim 10 further including means for heating said chemical liquid, said means for heating said chemical liquid being disposed in said outer basin below said inner basin.

14. The machine of claim 13 wherein said means for heating said chemical liquid includes an electrical resistance heating element disposed in a gap defined between said floor of said inner basin and a floor of said outer basin.

15. A processing line for chemically treating the surfaces of a planar printed circuit board work piece by immersion in a sequence of liquid chemical baths, said processing line comprising: support means holding plural sequentially-arranged machines each including a respective liquid chemical bath and carrying out a respective step in the chemical treating of the work piece, said sequentially-arranged machines each defining a respective section of a conveyor for moving the work piece in a horizontal orientation horizontally along an action line parallel to its own plane through said sequence of chemical baths of said sequentially-arranged machines, and said processing line including a first plurality of said machines carried at a lower level on said support means, and a second plurality of said machines carried on said support means and arranged vertically above said first plurality of machines.

16. A processing line for chemically treating the surfaces of a planar printed circuit board work piece by immersion in a sequence of liquid chemical baths, said processing line comprising: support means holding plural sequentially-arranged machines each including a respective liquid chemical bath and carrying out a respective step in the chemical treating of the work piece, said sequentially-arranged machines each defining a respective section of a conveyor for moving the work piece in a horizontal orientation horizontally along an action line parallel to its own plane through said sequence of chemical baths of said sequentially-arranged machines, and said processing line including a first plurality of said machines carried at a lower level on said support means, and a second plurality of said machines carried on said support means and arranged vertically above said first plurality of machines;

wherein at least one of said plural machines includes an inner basin for containing a bath of chemical liquid for treating the surfaces of the work piece, a respective section of said conveyor for moving the work piece through said bath of chemical liquid, an outer basin below and around said inner basin also for containing said chemical liquid, said inner basin having a floor defining a hole providing for gravitational draining of said chemical liquid bath downwardly into said outer basin, and means for effecting an up-welling of liquid from said outer basin upwardly through said hole into said inner basin to maintain a liquid level therein above the liquid level in said outer basin during operation of said machine.

* * * * *